(12) United States Patent
Lee et al.

(10) Patent No.: US 6,933,560 B2
(45) Date of Patent: Aug. 23, 2005

(54) POWER DEVICES AND METHODS FOR MANUFACTURING THE SAME

(76) Inventors: Suk-kyun Lee, 30/2 434-4, Sang-dong, Wonmi-gu, Bucheon-city, Gyeonggi-do (KR); Cheol-joong Kim, 1104-601 Boram Maeul, Joong 1-dong, Wonmi-gu, Bucheon-city, Gyeonggi-do (KR); Tae-hun Kwon, 1310-405, Shinsigaji Apt., Mok-dong, Yangcheong-gu, Seoul (KR)

( * ) Notice: Subject to any disclaimer, the term of this patent is extended or adjusted under 35 U.S.C. 154(b) by 0 days.

(21) Appl. No.: 10/661,952

(22) Filed: Sep. 12, 2003

(65) Prior Publication Data

US 2004/0065935 A1 Apr. 8, 2004

(30) Foreign Application Priority Data

Sep. 14, 2002 (KR) ................................ 10-2002-0055965

(51) Int. Cl.[7] .............................................. H01L 29/72
(52) U.S. Cl. ........................ 257/328; 257/329; 257/331
(58) Field of Search ................................ 257/328, 329, 257/331

(56) References Cited

U.S. PATENT DOCUMENTS 5,739,061 A * 4/1998 Kitamura et al. ........... 438/275

* cited by examiner

Primary Examiner—Edward Wojciechowicz
(74) Attorney, Agent, or Firm—Kenneth E. Horton; Kirton & McConkie

(57) ABSTRACT

Power devices in which a low on-resistance can be obtained while maintaining a high breakdown voltage and a method for manufacturing the power devices are described. The power device includes a semiconductor substrate having a first conductivity type, a burying layer having a high concentration of a second conductivity type arranged deep in the semiconductor substrate, a well having a low concentration of a second conductivity type formed on the burying layer of the semiconductor substrate, a body region having a first conductivity type formed in a predetermined portion in the well having a low concentration of a second conductivity type, first and second channel stop regions having a low concentration of a second conductivity type, the first and second channel stop regions are formed in a predetermined portion of the body region and on both edges of the body region having a first conductivity type, a gate electrode including a gate insulating layer, formed on a space between the first and second channel stop regions, source and drain regions having a high concentration of a second conductivity type formed in the first and second channel stop regions on both sides of the gate electrode, and a body contact region formed in the source region. Only the body region having a first conductivity type exists between the first and second channel stop regions, and a channel is formed between the first and second channel stop regions.

17 Claims, 3 Drawing Sheets

POWER DEVICES AND METHODS FOR MANUFACTURING THE SAME

REFERENCE TO RELATED APPLICATIONS

This application claims priority of Korean Patent Application No. 2002-55965, the entire disclosure of which is incorporated herein by reference.

FIELD OF THE INVENTION

The present invention relates to power devices and methods for manufacturing such power devices. More particularly, the invention relates to power devices in which a low on-resistance can be obtained while maintaining a high breakdown voltage, as well as methods for manufacturing such power devices.

BACKGROUND OF THE INVENTION

In general, a high-voltage lateral double diffused MOS transistor (LDMOS) is one type of power device that is widely used for control, logic, or power switches. The LDMOS transistor should have a high breakdown voltage that can be sustained even when a high voltage is applied to the LDMOS. The LDMOS transistor should also have a low on-resistance so that a high switching characteristic can be maintained.

FIG. 1 is a cross-sectional view illustrating a conventional LDMOS transistor. As shown in FIG. 1, a high-concentration n-type ($n^+$) burying layer 12 is formed deep in a p-type substrate 10, and a low-concentration n-type ($n^-$) epitaxial layer 14 (or an $n^-$ well) having a predetermined thickness is grown on the $n^+$ burying layer 12. A gate electrode 18 containing gate insulating layers 16a and 16b is formed in a predetermined portion on the $n^-$ epitaxial layer 14. The first gate insulating layer 16a has a thin film and the second gate insulating layer 16b has a thick film. A spacer 20 is formed by a well-known method on both sidewalls of the gate electrode 18.

A p body region 24 is formed under and to one side of the gate electrode 18. An $n^+$ source region 26 and a high concentration p-type ($p^+$) contact region 28 are formed in the p body region 24. In this transistor, the p body region 24 is formed with a relatively high concentration so that punch-through can be prevented from occurring in the LDMOS transistor.

The transistor illustrated in FIG. 1 also contains an $n^-$ channel stop region 30 with a predetermined junction depth under and on one side of the gate electrode 18. This transistor also contains an $n^+$ drain region 32 that is formed in the $n^-$ channel stop region 30. The $n^-$ channel stop region 30 is formed in the LDMOS transistor as a stopper for intercepting the extension of the channel. The $n^-$ channel stop region 30 has a concentration higher than the $n^-$ epitaxial layer 14, thereby reducing the on-resistance. At the same time, the $n^-$ channel stop region 30 has a relatively low concentration, thereby exhibiting a high breakdown voltage. The transistor illustrated in FIG. 1 also contains a gate, a source, and a drain that are connected to the gate electrode 18, the source region 26 and the $p^+$ contact region 28, and the drain region 32, respectively.

The conventional LDMOS transistor illustrated in FIG. 1 has a profile in which a body concentration of the channel region C is inclined. Further, the p body region 24 (where a channel is formed) is formed with a relatively high concentration in consideration of punch-through. Meanwhile, the $n^-$ epitaxial layer 14 is formed with a low concentration in consideration of the breakdown voltage. As a result, the on-resistance of the channel region C cannot be accurately controlled, and since the $n^-$ epitaxial layer 14 has a low concentration, a low on-resistance is not easily obtained.

SUMMARY OF THE INVENTION

In one aspect, the present invention relates to a power device. The power device includes a semiconductor substrate having a first conductivity type, a burying layer having a high concentration of a second conductivity type arranged deep in the semiconductor substrate, a well having a low concentration of a second conductivity type formed on the burying layer of the semiconductor substrate, a body region having a first conductivity type formed in a predetermined portion in the well having a low concentration of a second conductivity type, first and second channel stop regions having a low concentration of a second conductivity type, the first and second channel stop regions are formed in a predetermined portion of the body region and on both edges of the body region having a first conductivity type, a gate electrode including a gate insulating layer, formed on a space between the first and second channel stop regions, source and drain regions having a high concentration of a second conductivity type formed in the first and second channel stop regions on both sides of the gate electrode, and a body contact region formed in the source region. Only the body region having a first conductivity type exists between the first and second channel stop regions, and a channel is formed between the first and second channel stop regions such that a uniform concentration can be obtained in a channel region.

In this aspect of the invention, he first and second channel stop regions can be spaced apart from each other by a channel expected distance, and the first and second channel stop regions can have a concentration higher than that of the well. Also, the first and second channel stop regions can have enough low impurity concentration so that a desired breakdown voltage can be obtained, and the body region can have a first conductivity type with a sufficient high impurity concentration so that punch-through can be prevented. The junction depths of the source and drain regions can be the same as or smaller than those of the first and second channel stop regions. Also, the first conductivity type can be a p-type and the second conductivity type can be an n-type.

In another aspect, the present invention relates to a method for manufacturing a power device according to the following procedure. First, a burying layer having a high concentration of a second conductivity type is formed deep in a semiconductor substrate having a first conductivity type, and a well having a low concentration of a second conductivity type is formed on the burying layer having a high concentration of a second conductivity type of the semiconductor substrate. Next, a body region having a first conductivity type is formed in the well, and first and second channel stop regions having a low concentration of a second conductivity type are formed in the center and on both edges of the body region. After that, a gate electrode is formed on a space between the first and second channel stop regions, and source and drain regions having a high concentration of a second conductivity type are formed in the first and second channel stop regions on both sides of the gate electrode. Subsequently, a body contact region having a first conductivity type is formed in the source region.

In this aspect of the invention, the formation of the body region and the first and second channel stop regions can comprise implanting p-type impurities for a body region into a well, implanting n-type impurities for first and second channel stop regions into a predetermined region of the well, and activating the p-type and n-type impurities. The implantation of the p-type impurities for the body region can be performed by implanting boron (B) ions with a concentration of about $1\times10^{13}$ to about $2\times10^{13}$ atoms/cm$^2$. The implantation of the n-type impurities for the first and second channel stop regions can be performed by implanting arsenic (As) ions with a concentration of about $2\times10^{13}$ to about $4\times10^{13}$ atoms/cm$^2$.

BRIEF DESCRIPTION OF THE DRAWINGS

The above and the other aspects and advantages of the present invention will become more apparent by describing in detail a preferred aspect thereof with reference to the attached drawings, in which:

FIGS. 1, 2A–2D, and 3 illustrate specific aspects of the invention and are a part of the specification. Together with the following description, the Figures demonstrate and explain the principles of the invention. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will not be repeated.

DETAILED DESCRIPTION OF THE INVENTION

The present invention will be described more fully hereinafter with reference to the accompanying drawings in which a preferred aspect of the invention is shown. This invention may, however, be embodied in many different forms and should not be construed as being limited to the aspects set forth herein. Rather, these aspects are provided so that this disclosure will be thorough and complete, and will fully convey the scope of the invention to those skilled in the art.

Figure 1:
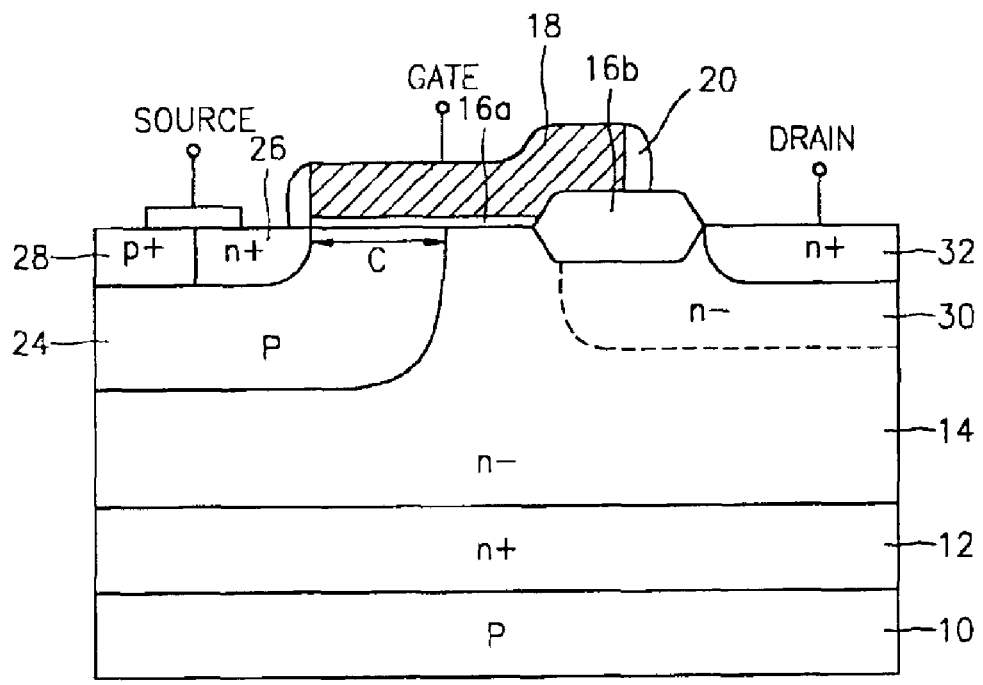
FIG. 1 is a cross-sectional view illustrating a conventional power device.
Figure 2A:
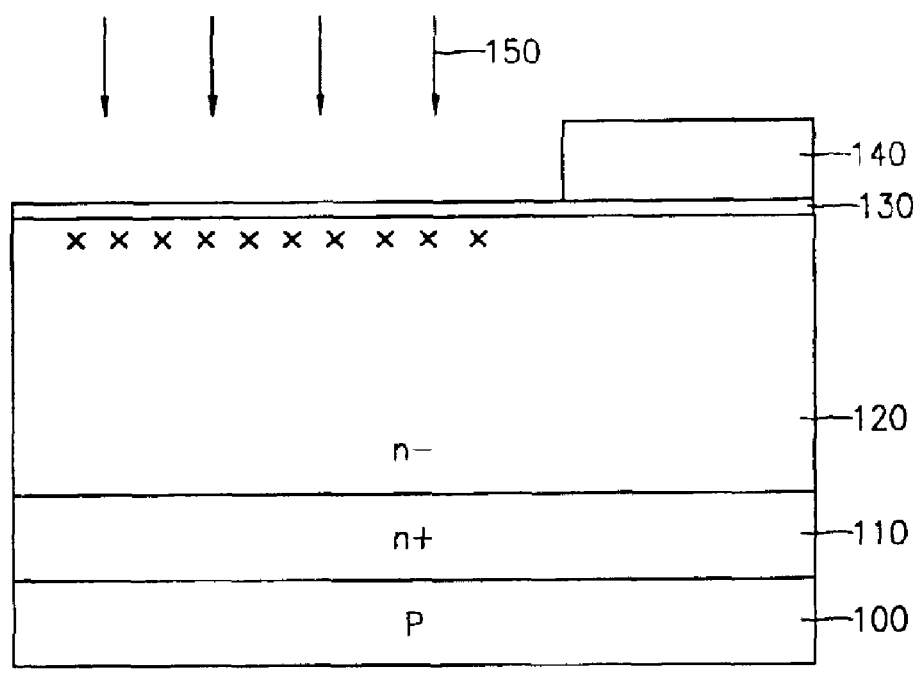
FIGS. 2A through 2D are cross-sectional views illustrating a process for making a power device according to one aspect of the present invention.

Referring to FIG. 2A, an n$^+$ burying layer 110 is formed in a semiconductor substrate 100 (for example, a p-type silicon substrate) by any well-known method in the art. For example, the n$^+$ burying layer 110 may be formed by an ion implantation process and then an activation (or drive-in) process to force the ions deep in the semiconductor substrate 100. Next, n-type impurities are implanted into the semiconductor substrate 100 above the n$^+$ burying layer 110 to activate the semiconductor substrate 100 and, therefore, form an n$^-$ well 120. In one aspect of the invention, an n$^-$ epitaxial layer may be grown instead of forming the n$^-$ well 120 by implantation.

After that, a buffer insulating layer 130 is formed on the resulting structure of the semiconductor substrate 100. Then, a photoresist pattern 140 is formed on the buffer insulating layer 130 so that a predetermined region of the semiconductor substrate 100 (i.e., where a p-body region will be formed) is exposed. In this aspect of the invention, the buffer insulating layer 130 serves to protect the surface of the semiconductor substrate 100 from the subsequent ion implantation process. Then, p-type impurities 150 (i.e., boron (B) ions) are implanted into the exposed part of the device where the p body region will be formed. In this case, the boron (B) ions are implanted with a concentration of about $1\times10^{13}$ to about $3\times10^{13}$ atoms/cm$^2$ and an energy of about 90 to about 110 KeV.

Figure 2B:
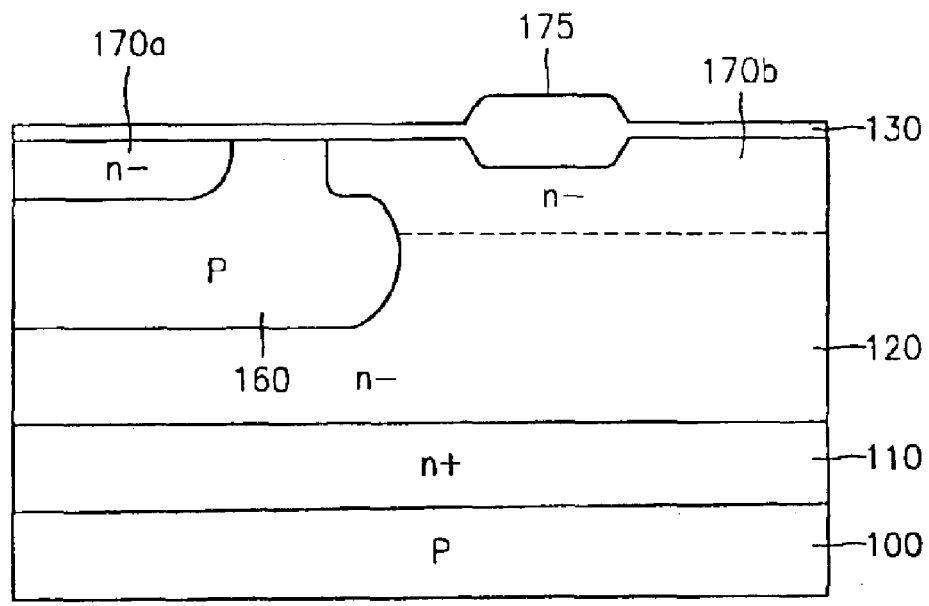

Next, as shown in FIG. 2B, the photoresist pattern 140 is removed by any well-known method. Then, another photoresist pattern (not shown) is formed and exposes a region of the device where a channel stop region is expected to be formed. Then, n$^-$ type impurities (i.e., arsenic (As) ions) are implanted in the region exposed by the photoresist pattern (i.e., the expected channel stop region). The arsenic (As) ions may be implanted with a concentration of about $2\times10^{13}$ to about $4\times10^{13}$ atoms/cm$^2$ and an energy of about 90 to about 110 KeV. After that, the ion-implanted p-type impurities 150 and the n$^-$ type impurities are activated (or driven-in) to form p body region 160 and channel stop regions 170a and 170b. In this aspect of the invention, even though the arsenic (As) ions and the boron (B) ions are implanted with about the same energy, the diffusion characteristics of boron (B) ions are better than that of arsenic (As) ions and, therefore, the boron ions diffuse more deeply than the arsenic ions. Thus, the depths of the channel stop regions 170a and 170b are shorter than the depth of the p body region 160.

In this aspect of the invention, the channel stop region of the device includes the first channel stop region 170a formed in the p body region 160 and the second channel stop region 170b formed on a lateral side of the p body region 160. The first channel stop region 170a is a region where a source of a LDMOS transistor will be formed. The second channel stop region 170b is a drift region of the LDMOS transistor, and its one side may be invaded into the lateral side of the p body region 160. In one aspect of the invention, the impurity concentrations of the first and second channel stop regions 170a and 170b are higher than that of the n$^-$ well 120. At the same time, the first and second channel stop regions 170a and 170b have impurity concentrations low enough so that a high breakdown voltage can be obtained regardless of an on-resistance.

In one aspect of the invention, before or after forming the p body region 160 and the first and second channel stop regions 170a and 170b, a local oxide layer 175 may be formed by any well-known method in a predetermined portion of the surface of the semiconductor substrate 100. The local oxide layer 175 can serve as a gate insulating layer for the power device and, therefore, is a thick film.

Figure 2C:
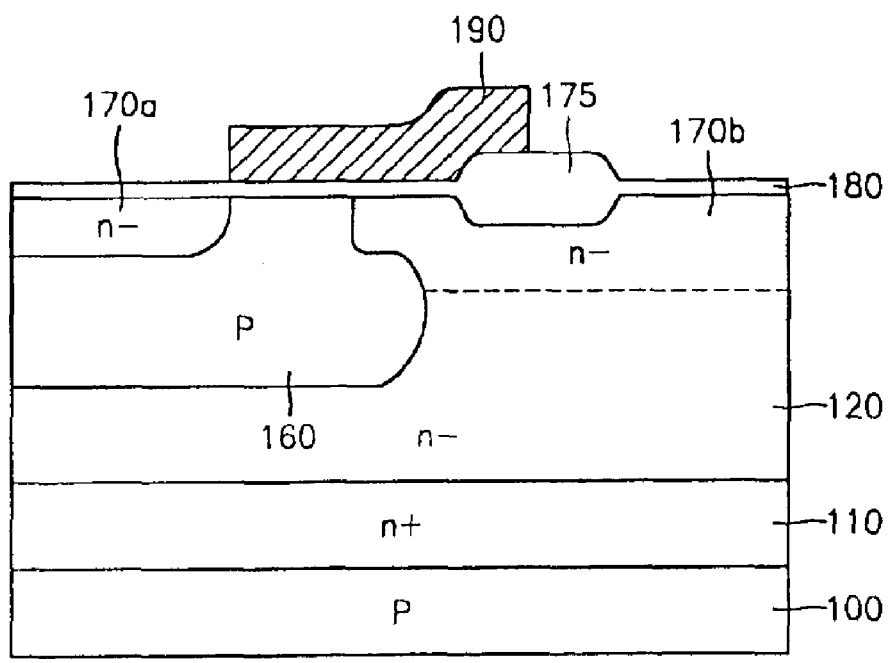

Next, as shown in FIG. 2C, the buffer insulating layer 130 is removed by any well-known method. Then, a gate insulating layer 180 is formed on the surface of the semiconductor substrate 100 by any well-known method. In one aspect of the invention, the buffer insulating layer 130 is not removed but is formed as the gate insulating layer 180. Next, a gate electrode 190 is formed over part of the first channel stop region 170a, part of the p body region 160, part of the second channel stop region 170b, and the local oxide layer 175. In one aspect of the invention, for example, a polysilicon layer may be used as the material for the gate electrode 190.

Figure 2D:
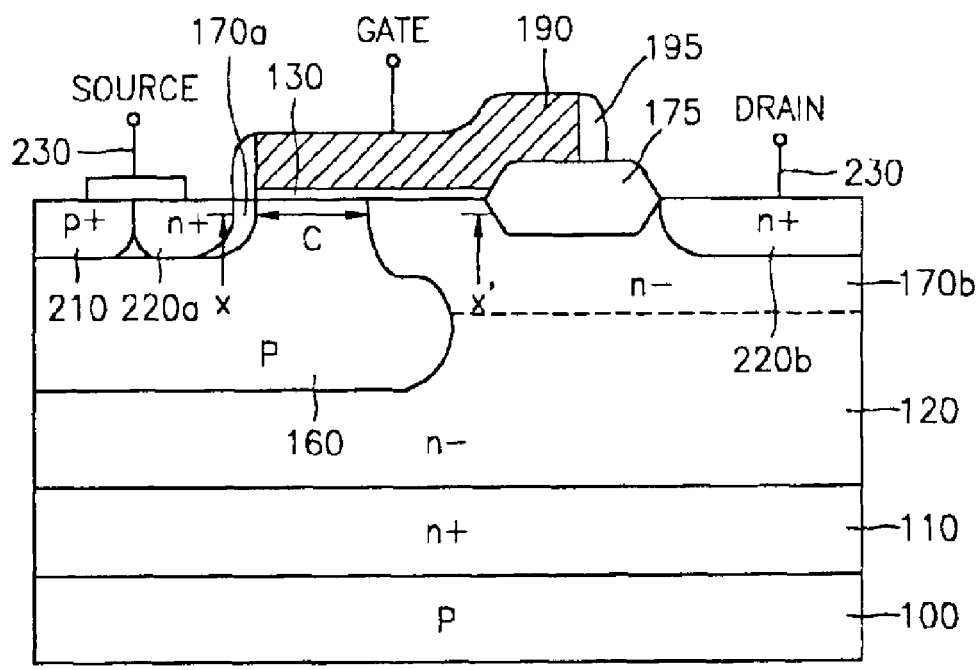

Next, as shown in FIG. 2D, a spacer 195 is formed by any well-known method on both sidewalls of the gate electrode 190. N⁺ impurities are then ion-implanted into the first and second channel stop regions 170a and 170b on both sides of the gate electrode 190 to form a source region 220a and a drain region 220b. In one aspect of the invention, the depths of the source and drain regions 220a and 220b may be substantially the same as or smaller than those of the n⁻ channel stop regions 170a and 170b. After that, p⁺ impurities are implanted into a predetermined portion of the source region 220a, thereby forming a body contact region 210. In this aspect of the invention, the body contact region 210 is used to apply an electrical signal to the p body region 160.

Next, an interlevel dielectric (ILD) film (not shown) is deposited on a resulting structure of the device. The ILD film is then etched so that the source and drain regions 220a and 220b are exposed, thereby forming a contact hole. Metallic interconnections 230 are formed to contact the exposed gate electrode 190 and the source and drain regions 220a and 220b. In the present invention, a transistor where the first and second channel stop regions 170a and 170b ate formed and diffused on both sides of the p body region 160 is referred to as a both sides diffused MOS (BDMOS) transistor.

Figure 3:
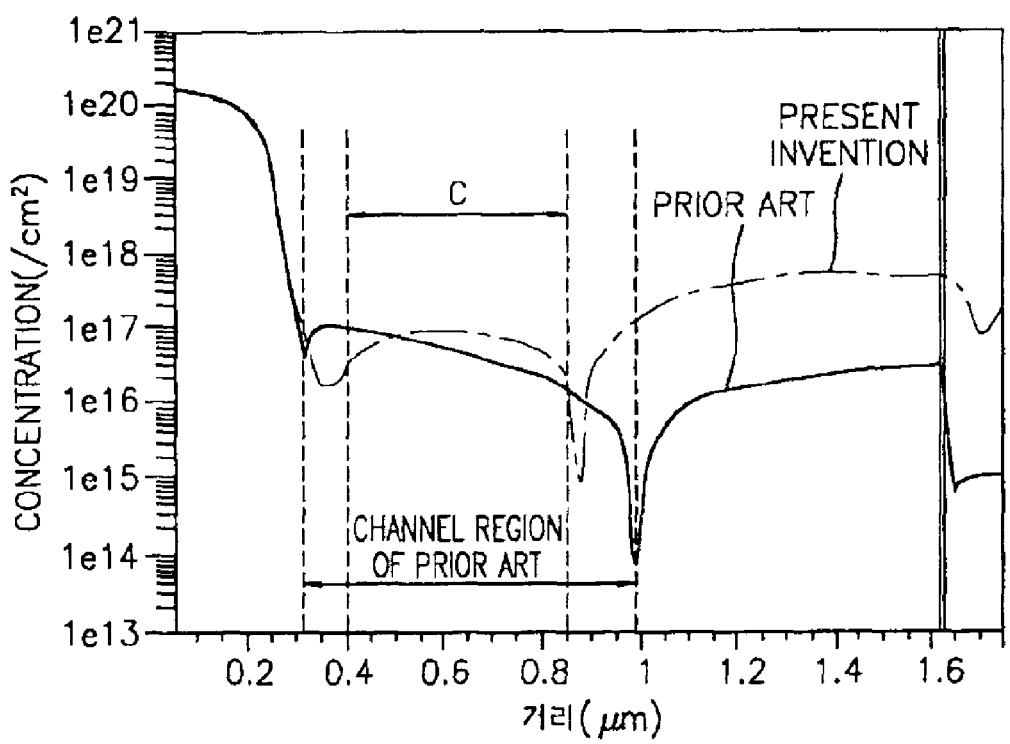
FIG. 3 is a graph comparing the impurity profile of the power device in one aspect of the present invention (taken along line x–x' of FIG. 2D) and the impurity profile of a conventional power device.

In the power device of the invention, the entire channel region C is formed in the p body region 160. As such, the channel region C has a uniform impurity profile. In other words, as shown in FIG. 3, the channel region of a conventional power device is diffused into the p body region and the n⁻ epitaxial layer. Thus, the conventional power device has an inclined impurity profile. The channel region of a power device according to the invention, however, is formed only in the p body region 160 and therefore has a uniform profile.

Since the channel region C has a uniform concentration, the length of the channel can be reduced, punch-through can be prevented, and a low on-resistance can be obtained. Further, since the second channel stop region 170b and the n⁻ well 120 are separated from the channel, the concentrations of the channel stop regions and the n⁻ well 120 can be adjusted so that a sufficiently high breakdown voltage can be obtained regardless of an on-resistance. In addition, since the n⁻ channel stop region 170b is formed in the vicinity of the surface of the semiconductor substrate 100 to invade the p body region 160, a similar reduced surface field or RESUF (an electric field on the surface of the semiconductor substrate 100) can be reduced. Further, since the source and drain regions can be formed by a self-align method, misalignment can be prevented.

As described above, in a power device according to the present invention, the concentration of a channel region of the power device is made uniform such that the length of a channel can be reduced, a uniform breakdown voltage can be maintained, and simultaneously, a low on-resistance can be obtained.

While this invention has been particularly shown and described with reference to a preferred aspect thereof, it will be understood by those skilled in the art that various changes in form and details may be made therein without departing from the spirit and scope of the invention as defined by the appended claims and equivalents thereof.

What is claimed is:

1. A power device comprising:
   a semiconductor substrate having a first conductivity type;
   a burying layer having a high concentration of a second conductivity type arranged deep in the semiconductor substrate;
   a well having a low concentration of a second conductivity type formed on the burying layer of the semiconductor substrate;
   a body region having a first conductivity type formed in a predetermined portion in the well having a low concentration of a second conductivity type;
   first and second channel stop regions having a low concentration of a second conductivity type, the first channel stop region being formed in a predetermined portion of the body region and the second channel stop region being formed on at least one side of the body region having a first conductivity type;
   a gate electrode including a gate insulating layer, formed on a space between the first and second channel stop regions;
   source and drain regions having a high concentration of a second conductivity type formed in the first and second channel stop regions on both sides of the gate electrode; and
   a body contact region formed in the source region;
   wherein only the body region having a first conductivity type exists between the first and second channel stop regions, and a channel is formed between the first and second channel stop regions such that a uniform concentration can be obtained in a channel region.

2. The power device of claim 1, wherein the first and second channel stop regions are spaced apart from each other by a channel expected distance.

3. The power device of claim 1, wherein the first and second channel stop regions have a concentration higher than that of the well.

4. The power device of claim 3, wherein the first and second channel stop regions have enough low impurity concentration so that a desired breakdown voltage can be obtained.

5. The power device of claim 1, wherein the body region having a first conductivity type has a sufficient high impurity concentration so that punch-through can be prevented.

6. The power device of claim 1, wherein junction depths of the source and drain regions are the same as or smaller than those of the first and second channel stop regions.

7. The power device of claim 6, wherein the first and second channel stop regions have enough low impurity concentration so that a desired breakdown voltage can be obtained.

8. The power device of claim 1, wherein the first conductivity type is a p-type, and the second conductivity type is an n-type.

9. The power device of claim 1, wherein the gate insulating layer includes a fist gate insulating layer having a thin film and a second gate insulating layer having a thick film, which are connected to each other without cutting.

10. The power device of claim 9, wherein the gate electrode includes part of the first channel stop region, part of the body region, part of the second channel stop region, and part of the second gate insulating layer.

11. A transistor, comprising:
    a substrate having a first conductivity type containing a well having a low concentration of a second conductivity type;
    a body region having a first conductivity type formed in a portion of the well; and
    first and second channel stop regions having a low concentration of a second conductivity type, the first channel stop region formed in a portion of the body region and the second channel stop region formed on a side of the body region;
    wherein a channel with a substantially uniform impurity concentration is located between the first and second channel stop regions.

12. The transistor of claim 11, further comprising a buried layer with a high concentration of a second conductivity type located between the substrate and the well.

13. The transistor of claim 11, further comprising source and drain regions having a high concentration of a second conductivity type formed in the first and second channel stop regions.

14. The transistor of claim 11, wherein only the body region exists between the first and second channel stop regions.

15. The transistor of claim 11, wherein the first and second channel stop regions have a concentration higher than that of the well.

16. The transistor of claim 15, wherein the first and second channel stop regions have a concentration low enough so that a desired breakdown voltage can be obtained.

17. The transistor of claim 11, wherein the body region has a concentration so that punch-through can be reduced.

* * * * *